(12) United States Patent
Hasegawa et al.

(10) Patent No.: US 7,755,529 B2
(45) Date of Patent: Jul. 13, 2010

(54) A/D CONVERTER TO CONVERT AN ANALOG SIGNAL FROM A BRIDGE CIRCUIT TO A DIGITAL SIGNAL

(75) Inventors: Kazuo Hasegawa, Oizumi-machi (JP); Hirohisa Suzuki, Oizumi-machi (JP)

(73) Assignees: Sanyo Electric Co., Ltd., Osaka (JP); Sanyo Semiconductor Co., Ltd., Gunma (JP)

( * ) Notice: Subject to any disclaimer, the term of this patent is extended or adjusted under 35 U.S.C. 154(b) by 0 days.

(21) Appl. No.: 12/338,875

(22) Filed: Dec. 18, 2008

(65) Prior Publication Data
US 2009/0160688 A1 Jun. 25, 2009

(30) Foreign Application Priority Data
Dec. 21, 2007 (JP) ............................ 2007-330559

(51) Int. Cl.
*H03M 1/12* (2006.01)
(52) U.S. Cl. ...................................... 341/155; 341/143
(58) Field of Classification Search .......... 341/143–155
See application file for complete search history.

(56) References Cited

U.S. PATENT DOCUMENTS 5,920,273 A * 7/1999 Hirano ...................... 341/143
6,204,789 B1 * 3/2001 Nagata ...................... 341/143
7,089,146 B1 * 8/2006 D'Aquino et al. .......... 341/136
7,495,589 B1 * 2/2009 Trifonov et al. ............. 341/155

FOREIGN PATENT DOCUMENTS

JP 2001-091373 4/2001

OTHER PUBLICATIONS

Nolan, Eric, Demystifying Auto-Zero Amplifiers-Part 1 Analog Dialogue, Analog Devices, Inc., vol. 34-2, pp. 1-3.

* cited by examiner

*Primary Examiner*—Lam T Mai
(74) *Attorney, Agent, or Firm*—SoCal IP Law Group LLP; Steven C. Sereboff; John E. Gunther

(57) ABSTRACT

An AD converter comprising: a delta-sigma-modulation circuit to output an analog signal from a bridge circuit as a quantized signal; a switch circuit to switch between a first state, where a first level voltage is applied to one terminal of the bridge circuit and a second level voltage different in level from the first level voltage is applied to the other terminal thereof, and a second state, where voltages opposite in level to those in the first state are applied thereto, based on a logic level of a control signal; and an up-down counter to increase a count value based on a rate of the quantized signal being one logic level, during a predetermined period, in the first state, and decrease the count value based on the rate, during the predetermined period, in the second state, the count value representing a digital signal according to the physical quantity.

6 Claims, 7 Drawing Sheets

A/D CONVERTER TO CONVERT AN ANALOG SIGNAL FROM A BRIDGE CIRCUIT TO A DIGITAL SIGNAL

CROSS-REFERENCE TO RELATED APPLICATION

This application claims the benefit of priority to Japanese Patent Application No. 2007-330559, filed Dec. 21, 2007, of which full contents are incorporated herein by reference.

BACKGROUND OF THE INVENTION

1. Field of the Invention

The present invention relates to an AD (analog to digital) converter.

2. Description of the Related Art

In a sensor circuit for processing physical quantity, such as acceleration and magnetism, detected by a sensor, offset adjustment is generally performed in order to more precisely process the physical quantity to be detected (see Japanese Laid-Open Patent Publication No. 2001-91373, for example). There is shown in FIG. 7 an example of a sensor circuit 500 for processing an output from a bridge circuit 600 to be used as an acceleration sensor. A preamplifier 610 amplifies an output from the bridge circuit 600, to be output to a delta-sigma AD converter including a delta-sigma modulation circuit 620 and a digital filter 630. The delta-sigma AD converter converts an output from the preamplifier 610 into a digital value, and an output interface circuit 640 outputs the digital value to a microcomputer (not shown.)

As a first example of an offset adjustment method in the sensor circuit 500, a method is cited where only a polarity of a voltage applied to the bridge circuit 600 is changed and the digital value in one state where the polarity of the voltage is not changed and the other state where the polarity of the voltage is changed are compared in the microcomputer (not shown.) Specifically, first of all, the control circuit 650 controls switches SW100 to SW130, so that a power supply VCC is connected to a node VA to which resistors R100 and R110 are connected, and a ground GND is connected to a node VB to which resistors R120 and R130 are connected, respectively. And then, the output interface 640 outputs to the microcomputer (not shown) the digital value in a state where the power supply VCC is connected to the node VA and the ground GND is connected to the node VB. Next, the control circuit 650 controls the switches SW100 to SW130, so that the ground GND is connected to the node VA and the power supply VCC is connected to the node VB, respectively. And then, the output interface circuit 640 outputs to the microcomputer (not shown) the digital value in a state where the ground GND is connected to the node VA and the power supply VCC is connected to the node VB. Thus, in a case where only the polarity is changed of the voltage applied to the bridge circuit 600, the polarity of the output from the bridge circuit 600 is changed, however, the polarities of offsets in the preamplifier 610 and the delta-sigma modulation circuit 620 are not changed. Therefore, an offset of the sensor circuit 500 can be cancelled by comparing the digital values in the above-mentioned different states in the microcomputer (not shown.)

Furthermore, as a second example of the offset adjustment method, there is cited a method of using a chopper amplifier, etc., in order to reduce an offset of the preamplifier 610, for example (see non-patent document: Eric Nolan, "Demystifying Auto-Zero Amplifiers-Part 1," Analog Dialogue, Analog Devices, Inc., March, 2000, vol. 34-2, pp. 1-3.)

In the case where the polarity of the voltage applied to the bridge circuit 600 is changed and the digital values in the different states are compared in the microcomputer (not shown) as described in the above first example, there is a problem that processing in the microcomputer (not shown) increases due to the adjustment of the offset of the sensor circuit 500. Moreover, in the case where the offset adjustment is performed only for the preamplifier 610 as described in the above second example, there is a problem that the adjustment has no effect on an offset generated in the delta-sigma modulation circuit 620 which is a circuit including an analog circuit other than the preamplifier 610 including that, for example.

SUMMARY OF THE INVENTION

An AD converter according to an aspect of the present invention, comprises: a delta-sigma modulation circuit configured to perform delta-sigma modulation for an analog signal from a bridge circuit, and output a delta-sigma modulated signal as a quantized signal, the bridge circuit being configured to output the analog signal according to physical quantity to be measured; a switch circuit configured to switch between a first state and a second state based on a logic level of a control signal, the first state being a state where a voltage of a first level is applied to one terminal of the bridge circuit and a voltage of a second level different from the first level is applied to the other terminal of the bridge circuit, the second state being a state where the voltage of the second level is applied to the one terminal and the voltage of the first level is applied to the other terminal; and an up-down counter configured to increase a count value based on a rate of the quantized signal being one logic level, during a predetermined period, when the bridge circuit is in the first state, and decrease the count value based on a rate of the quantized signal being one logic level, during the predetermined period, when the bridge circuit is in the second state, the count value being a value to be a digital signal according to the physical quantity.

Other features of the present invention will become apparent from descriptions of this specification and of the accompanying drawings.

BRIEF DESCRIPTION OF THE DRAWINGS

For more thorough understanding of the present invention and advantages thereof, the following description should be read in conjunction with the accompanying drawings, in which.

DETAILED DESCRIPTION OF THE INVENTION

At least the following details will become apparent from descriptions of this specification and of the accompanying drawings.

Figure 1:
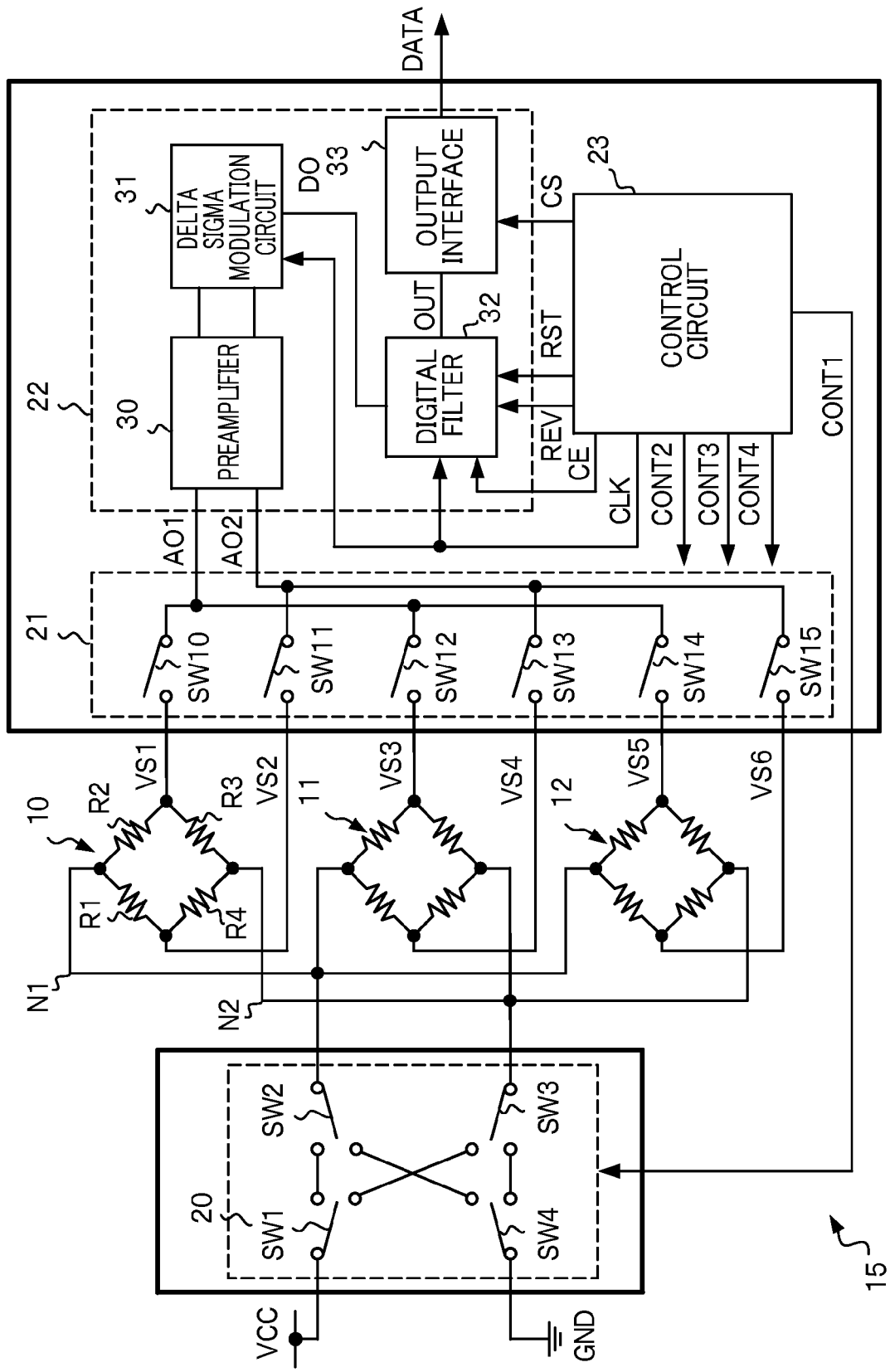
FIG. 1 is a diagram showing configurations of sensors 10 to 12 and a sensor circuit 15 for processing outputs from the sensors 10 to 12 of an AD converter according to an embodiment of the present invention.

FIG. 1 is a diagram showing a configuration of sensors 10 to 12 and a sensor circuit 15 for processing outputs from the sensors 10 to 12 according to an embodiment of the present invention.

The sensors 10 to 12 are acceleration sensors for respectively detecting acceleration of an x-axis, a y-axis, and a z-axis, and respectively outputs output voltages VS1 and VS2 according to the acceleration of the x-axis, output voltages VS3 and VS4 according to the acceleration of the y-axis, output voltages VS5 and VS6 according to the acceleration of the z-axis, by being connected with a power supply VCC and a ground GND, for example. According to an embodiment of the present invention, it is assumed that each of the sensors 10 to 12 has the same configuration, and therefore, detailed description will be given only for the sensor 10. Moreover, a voltage value of the power supply VCC will hereinafter be represented as VCC.

The sensor 10 is a bridge circuit where resistors R1 to R4 are bridge-connected. When a voltage between a node N1 (one terminal) connected with the resistors R1 and R2, and a node N2 (the other terminal) connected with the resistors R3 and R4 is VCC, the sensor 10 respectively outputs the output voltages VS1 and VS2 according to the acceleration of the x-axis, from a node connected with the resistors R2 and R3, and a node connected with the resistors R1 and R4. In an embodiment according to the present invention, it is assumed that when the voltage between the node N1 and the node N2 is VCC and the acceleration of the x-axis is zero, each of the output voltages VS1 and VS2 from the sensor 10 is (½)× VCC. Furthermore, when the polarity of the voltage between the node N2 and the node N1 is reversed, the outputs from the sensors 10 to 12 are also reversed, in the sensors 10 to 12 according to an embodiment of the present invention. That is, for example, the sensor 10 is designed such that voltages Va and Vb are respectively output as the output voltages VS1 and VS2 in a case where the voltage between the node N2 and the node N1 is +VCC, and the voltages Vb and Va are respectively output as the output voltages VS1 and VS2 in a case where the voltage between the node N2 and the node N1 is −VCC.

It is assumed that two nodes except nodes for outputting the output voltages VS3 and VS4 in the sensor 11 are connected to the nodes N1 and N2, respectively, and two nodes except nodes for outputting the output voltages VS5 and VS6 in the sensor 12 are also connected to the nodes N1 and N2, respectively.

The sensor circuit 15 is a circuit for converting the output voltages VS1 to VS6 output from the sensors 10 to 12 into digital values, to be output to a microcomputer (not shown) as data DATA. The sensor circuit 15 includes a first switch circuit 20, a second switch circuit 21, a processing circuit 22, and a control circuit 23. The first switch circuit 20 corresponds to a switch circuit according to an embodiment of the present invention.

First, outlines will be described of circuits included in the sensor circuit 15.

The first switch circuit 20 is a circuit for changing the polarity of the voltage of the nodes N1 and N2 so that the voltage between the node N2 and the node N1 in the sensors 10 to 12 is +VCC or −VCC based on a control signal CONT1 from the control circuit 23, and includes switches SW1 to SW4.

The second switch circuit 21 is a circuit for selecting two output voltages output from any one sensor among the sensors 10 to 12 based on the control signals CONT2 to CONT4 from the control circuit 23 to be output to the processing circuit 22 as output signals AO1 and AO2, and includes switches SW10 to SW15.

The processing circuit 22 is a circuit for converting into digital signals corresponding to analog output signals AO1 and AO2 indicating the outputs from the sensors 10 to 12 based on an enable signal CE, a clock signal CLK, a reversal signal REV, and a reset signal RST that are input from the control circuit 23, and for outputting the converted digital signals as the data DATA to the microcomputer (not shown) based on output instruction signal CS, and includes a preamplifier 30, a delta-sigma modulation circuit 31, a digital filter 32, and an output interface 33.

The control circuit 23 is a circuit for outputting the control signal CONT1 to the first switch circuit 20, outputting the control signals CONT2 to CONT4 to the second switch circuit 21, and outputting the enable signal CE, the clock signal CLK, the reversal signal REV, the reset signal RST, and the output instruction signal CS to the processing circuit 22, in predetermined timing, and is a sequencer, for example.

Next, configurations of circuits making up the sensor circuit 15 will be described.

In the first switch circuit 20, one end of each of the switches SW1 to SW4 is respectively connected to the power supply VCC, the node N1, the node N2, and ground GND. According to an embodiment of the present invention, when the control signal CONT1 from the control circuit 23 is a high level (hereinafter, "H level"), it is assumed that the other end of switch SW1 is connected with the other end of switch SW2 and the other end of switch SW3 is connected with the other end of switch SW4. On the other hand, when the control signal CONT1 is a low level (hereinafter, "L level"), it is assumed that the other end of switch SW1 is connected with the other end of switch SW3 may be connected and the other end of switch SW2 is connected with the other end of switch SW4. That is, when the control signal CONT1 is H level, the nodes N1 and N2 are connected to the power supply VCC and ground GND, respectively, and when the control signal CONT1 is L level, the nodes N1 and N2 are connected to ground GND and the power supply VCC, respectively. Hereinafter, in an embodiment of the present invention, a state where the nodes N1 and N2 are connected to the power supply VCC and ground GND, respectively, is designated as a first sate, and a state where the nodes N1 and N2 are connected to the ground GND and the power supply VCC, respectively, is designated as a second state.

In the second switch circuit 21, the output voltages VS1 and VS2 from the sensor 10 are respectively applied to one-side ends of switches SW10 and SW11, the output voltages VS3 and VS4 from the sensor 11 are respectively applied to one-side ends of switches SW12 and SW13, and the output voltages VS5 and VS6 from the sensor 12 are applied to one-side ends of switches SW14 and SW15. According to an embodiment of the present invention, it is assumed that when the control signal CONT2 is H level, only the switches SW10 and SW11 are turned on so that the output voltages VS1 and VS2 from the sensor 10 are output as the output signals AO1 and AO2. Similarly, it is assumed that when the control signal CONT3 is H level, only the switches SW12 and SW13 are turned on so that the output voltages VS3 and VS4 are output as the output signals AO1 and AO2, and when the control signal CONT4 is H level, only the switches SW14 and SW15 are turned on so that the output voltages VS5 and VS6 are output as the output signals AO1 and AO2. It is also assumed that when the control signals CONT2 to CONT4 are L level, the switches SW10 to SW15 are turned off.

The preamplifier 30 in the processing circuit 22 is a circuit for amplifying the output signals AO1 and AO2 output from the second switch circuit 21 by a predetermined gain, to be output to the delta-sigma modulation circuit 31.

Figure 2:
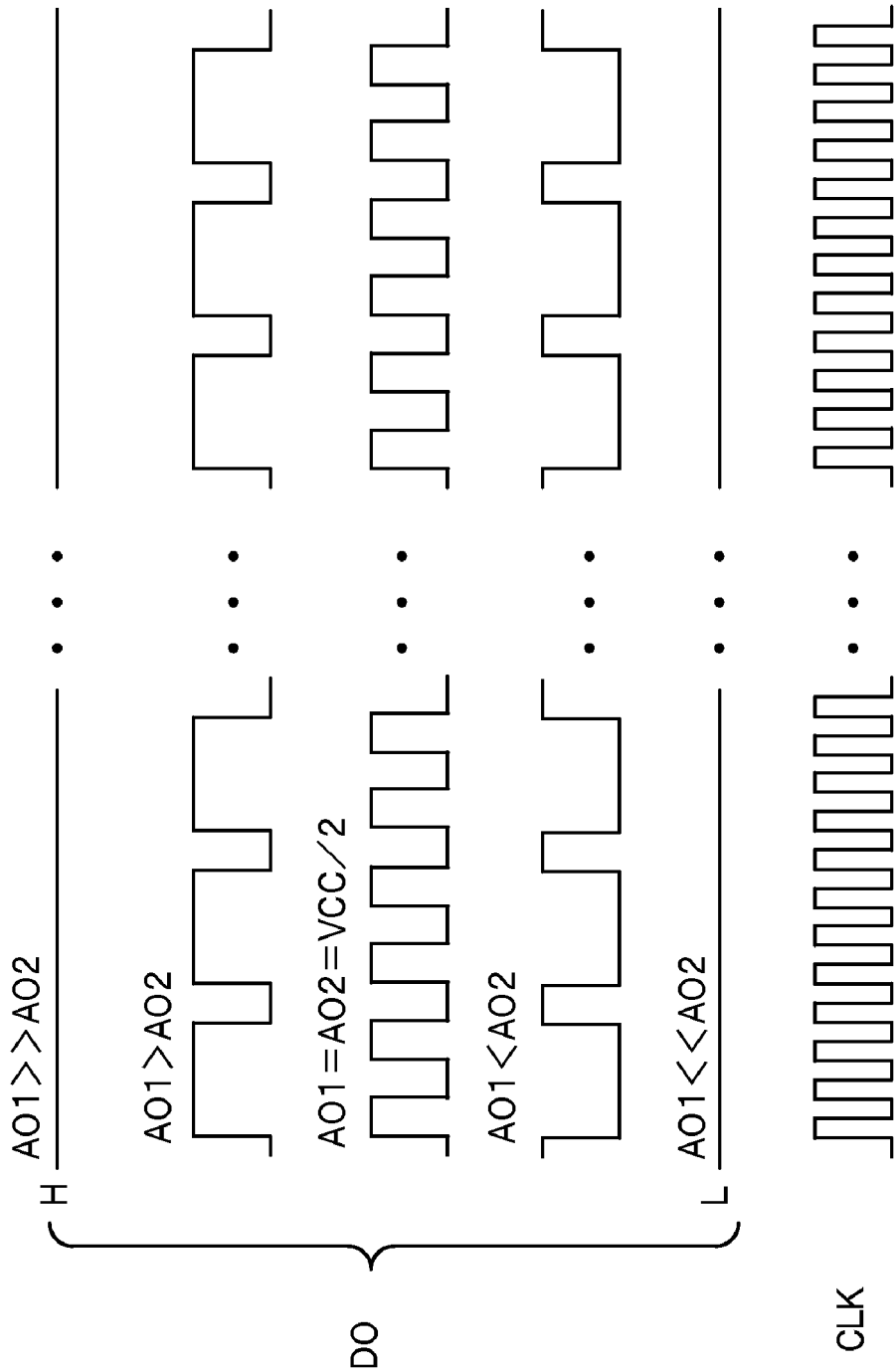
FIG. 2 is a diagram showing an example of an output from a delta-sigma modulation circuit 31 according to an embodiment of the present invention.

The delta-sigma modulation circuit 31 is a circuit for outputting a signal input from the preamplifier 30 as a one-bit digital signal DO in synchronization with the clock signal CLK input from the control circuit 23. As shown in FIG. 2, in an embodiment according to the present invention, a rate of the digital signal DO being H level increases as the output signal AO1 becomes greater in level than the output signal AO2, and a rate of the digital signal DO being L level increases as the output signal AO1 becomes smaller in level than the output signal AO2. That is, the delta-sigma modulation circuit 31 is assumed to be designed such that the digital signal DO stays H level when the output signal AO1 is greater in level than the output signal AO2 sufficiently (AO1>>AO2), and the digital signal DO stays L level when the output signal AO1 is smaller in level than the output signal AO2 sufficiently (AO1<<AO2). Furthermore, the delta-sigma modulation circuit 31 is assumed to be designed such that the rate of the digital signal DO being H level and the rate of the digital signal DO being L level are the same when the output signal AO1 and the output signal AO2 are the same in level and each of voltages thereof is VCC/2 (AO1=AO2=VCC/2), that is, when an acceleration of the x-axis is zero. As mentioned above, the sensor 10 is designed such that the voltage value of the output voltage VS1 and the voltage value of the output voltage VS2 output from the sensor 10 are exchanged with each other when the polarity of the voltage between the node N2 and the node N1 is reversed. Therefore, when a state of the nodes N1 and N2 is changed from the first state to the second state, a difference between the output signal AO1 and the output signal AO2 is also reversed, and the rate of the digital signal DO being H level and the rate of the digital signal DO being L level are also reversed.

The digital filter 32 is a circuit which attenuates high frequency noise in the digital signal DO, and converts the one-bit digital signal DO into a multi-bit digital signal OUT. As will be described later in detail, the digital filter 32 according to an embodiment of the present invention operates as an adding circuit when the reversal signal REV is L level, and operates as an adding circuit which performs a complementary operation by two's complement when the reversal signal REV is H level, in order to attenuate the high frequency noise of the digital signal DO and output the multi-bit digital signal OUT as mentioned above. The delta-sigma modulation circuit 31 and the digital filter 32 makes up a delta-sigma AD converter. The digital filter 32 according to an embodiment of the present invention operates with the same clock signal CLK as the clock signal CLK input to the delta-sigma modulation circuit 31.

The output interface circuit 33 is a circuit for outputting the digital signal OUT to the microcomputer (not shown) as the data DATA in response to the output instruction signal CS of H level input from the control circuit 23.

Figure 3:
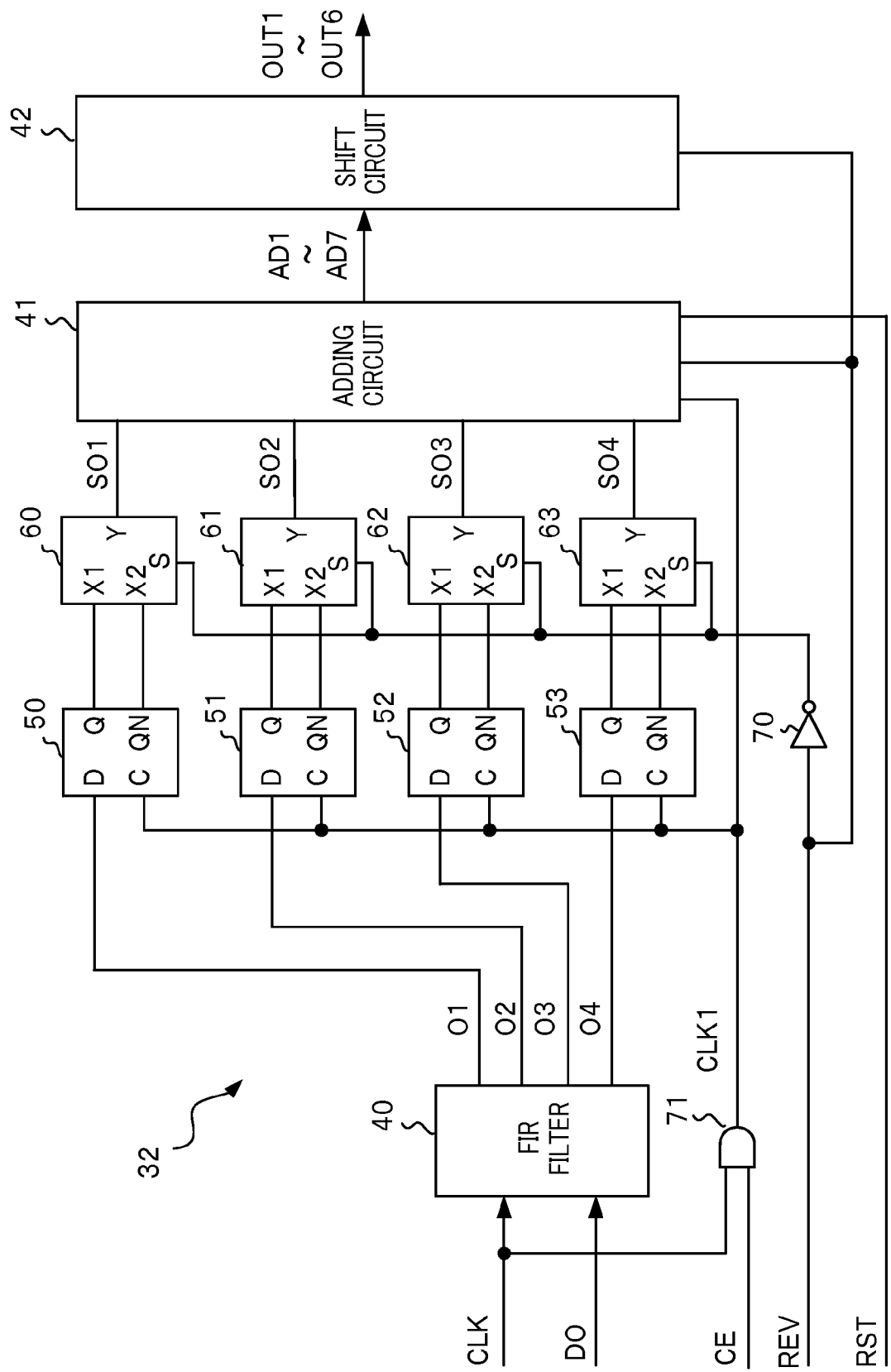
FIG. 3 is a diagram showing an example of a digital filter 32 according to an embodiment of the present invention.

As shown in FIG. 3, the digital filter 32 according to an embodiment of the present invention includes a FIR filter 40, an adding circuit 41, a shift circuit 42, D flip-flops 50 to 53, selectors 60 to 63, an inverter 70, and an AND circuit 71. The FIR filter 40, the adding circuit 41, the D flip-flops 50 to 53, the selectors 60 to 63, the inverter 70, and the AND circuit 71 correspond to an up-down counter according to an embodiment of the present invention, the FIR filter 40 corresponds to a filter according to an embodiment of the present invention, the adding circuit 41, the D flip-flops 50 to 53, the selectors 60 to 63, the inverter 70, and the AND circuit 71 corresponds to an adding and subtracting circuit according to an embodiment of the present invention, and the shift circuit 42 corresponds to a shift operation circuit according to an embodiment of the present invention.

First, circuits making up the digital filter 32 will be described in detail.

The FIR filter 40 is a filter holds and adds, for example, 16 bits of the one-bit digital signal DO which is input in sequence from the delta-sigma modulation circuit 31 in synchronization with the clock signal CLK, and outputs an addition result as 4-bit output signals O1 to O4, in synchronization with the clock signal CLK, in order to attenuate the high frequency component in the one-bit digital signal DO. In an embodiment according to the present invention, it is assumed that a filter order is 16 and a filter factor of each order is 1. The output signals O1 to O4 correspond to 4-bits in order from the most significant bit to the least significant bit.

The output signals O1 to O4 from the FIR filter 40 are respectively input to D inputs of the D flip-flops 50 to 53. Since the clock signals CLK1 output from the AND circuit 71 are input to C inputs of the D flip-flops 50 to 53 based on the clock signal CLK when the enable signal CE is H level, the output signals O1 to O4 of the FIR filter 40 are respectively output in sequence from Q outputs of the D flip-flops 50 to 53 based on the clock signal CLK1. Signals obtained by reversing the output signals O1 to O4 of the FIR filter 40 are respectively output from QN outputs of the D flip-flops 50 to 53 based on the clock signal CLK1.

Figure 4:
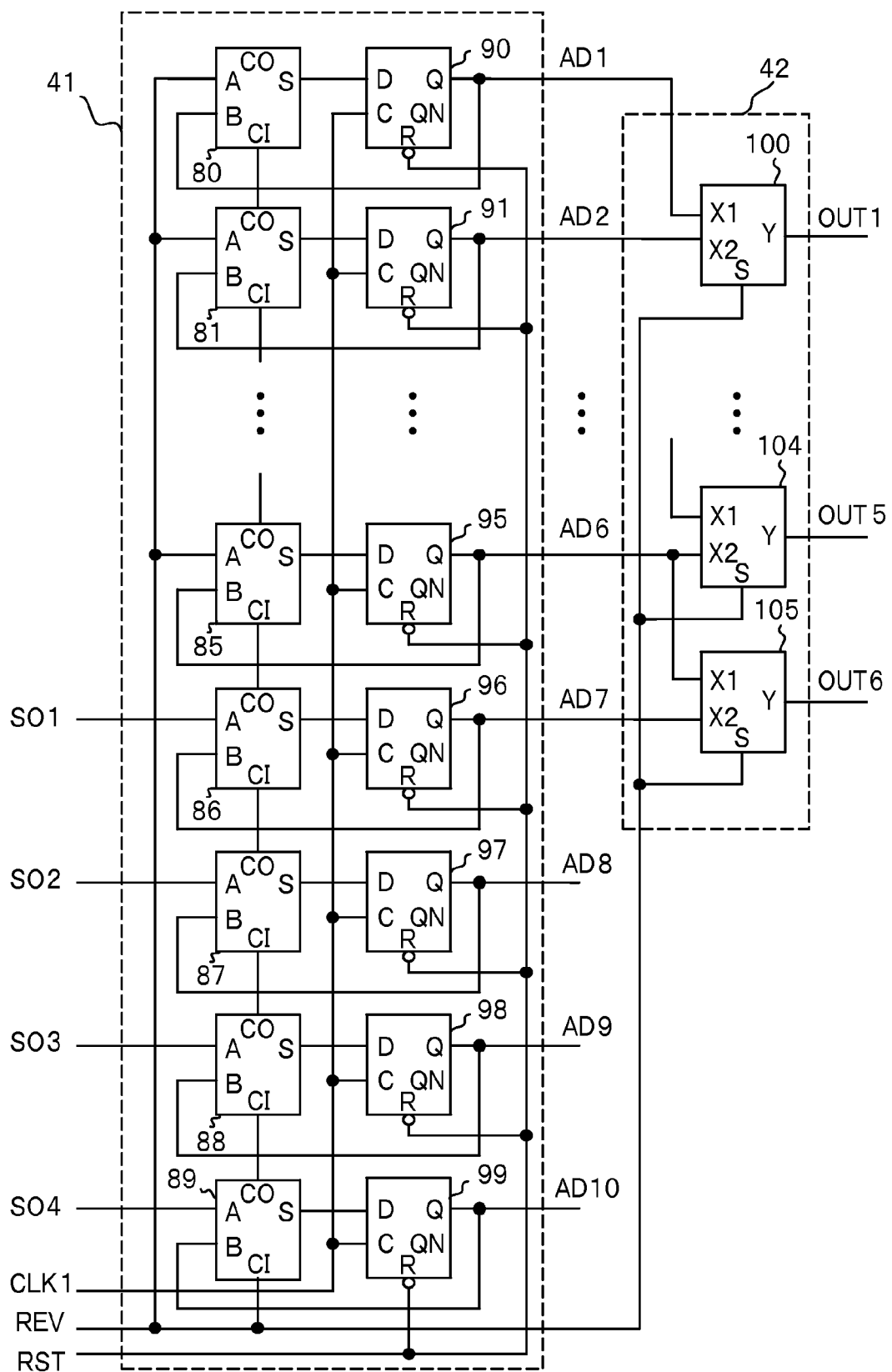
FIG. 4 is a diagram showing examples of an adding circuit 41 and shift circuit 42 according to an embodiment of the present invention.

The selector 60 is a circuit that outputs a signal input to an X1 input thereof from a Y output thereof when a signal of H level is input to an S input, and that outputs a signal input to the X2 input thereof from the Y output when a signal of L level is input to the S input thereof. In an embodiment according to the present invention, it is assumed that the selectors 61 to 63 are the same as the selector 60, and the signals output from Y outputs of the selectors 60 to 63 are the output signals SO1 to SO4, respectively. The Q outputs from the D flip-flops 50 to 53 are input to X1 inputs of the selectors 60 to 63, and the QN outputs from the D flip-flops 50 to 53 are input to X2 inputs of the selectors 60 to 63. Since the signal of H level is input from the inverter 70 to S inputs of the selectors 60 to 63 when the reversal signal REV is L level, data of bits of the output signals O1 to O4 are output from the Y outputs of the selectors 60 to 63 as the output signals SO1 to SO4. On the other hand, when the reversal signal REV is H level, the data obtained by reversing bits of the output signals O1 to O4 are output from the Y outputs of the selectors 60 to 63 as the output signals SO1 to SO4 accordingly. The adding circuit 41 is a circuit that sequentially adds the output signals S01 to SO4 output from the selectors 60 to 63 in synchronization with the clock signal CLK1, and the reversal signal REV, and that includes full adders 80 to 89 and D flip-flops 90 to 99 illustrated in FIG. 4.

The full adder 80 is a circuit that adds a one-bit signal input to an A input thereof, a one-bit signal input to a B input thereof, and a one-bit carry signal input to a CI input thereof, and outputs a one-bit addition result from an S output thereof, and outputs a one-bit carry signal from a CO output thereof. In an embodiment according to the present invention, it is assumed that the full adders 81 to 89 are also the same as above. The S output of the full adder 80 is connected with a D input of the D flip-flop 90, and a Q output of the D flip-flop 90 is connected with the B input of the full adder 80. Here, an operation will be described of the full adder 80 and the D flip-flop 90 by giving an example of a case where the pulse signal which is H level for a predetermined period is input twice to a C input of the D flip-flop 90. It is assumed that the reset signal RST is H level. First, when a first pulse signal is input to the C input of D flip-flop 90, the addition result (hereinafter, "first addition result") output from the S output of the full adder 80 is output from a Q output of the D flip-flop 90. Therefore, the first addition result is input to the B input of the full adder 80, and is further added to the signals input to the A input and the CI input of the full adder 80. An addition result of the above-mentioned first addition result input to the B input and the signals input to the A input and the CI input is designated as a "second addition result." Next, when a second pulse signal is input to the C input of the D flip-flop 90, the second addition result is output from the Q output. That is, the full adder 80 and the D flip-flop 90 serve as a circuit for adding a one-bit signal input to the A input of the full adder 80, a one-bit signal input to the B input thereof, and a one-bit signal input to the CI input sequentially, and outputting the addition result from the Q output of the D flip-flop 90, based on the clock signal input to the C input of the D flip-flop 90. The S outputs and the B inputs of the full adders 81 to 89 are connected with the D inputs and the Q outputs of the D flip-flops 91 to 99, respectively. That is, the adding circuit 41 according to an embodiment of the present invention is a 10-bit adding circuit.

Here, when the reversal signal REV is L level, 0 (zero) is input to the CI input of the full adder 89 and the output signals SO1 to SO4 input to the A inputs of the full adders 86 to 89 are the output signals O1 to O4 output from the FIR filter 40. Therefore, the output signals O1 to O4 are sequentially added based on the clock signal CLK1. On the other hand, when the reversal signal REV is H level, 1 is input to the A inputs of the full adders 80 to 85 and the CI input of the full adder 89, and the output signals SO1 to SO4 input to the A inputs of the full adders 86 to 89 are signals obtained by reversing bits of the output signals O1 to O4 output from the FIR filter 40. Therefore, when the reversal signal REV is H level, the output signals O1 to O4 become in two's complement representation and are sequentially added, based on the clock signal CLK1. That is, when the reversal signal REV is H level, the output signals O1 to O4 are sequentially subtracted. According to an embodiment of the present invention, signals output from Q outputs of the D flip-flops 90 to 99 are designated as output signals AD1 to AD10. In the adding circuit 41, the output signals AD1 to AD10 correspond to 10-bits in order from the most significant bit to the least significant bit. Since the D flip-flops 90 to 96 are reset when the reset signal RST is L level, the output signals AD1 to AD10 are reset.

The shift circuit 42 according to an embodiment of the present invention is a circuit that performs a one-bit right shift based on the reversal signal REV for higher-order 7-bit output signals AD1 to AD7 among the 10-bit output signals AD1 to AD10 output from the adding circuit 41, to be output as 6-bit output signals OUT1 to OUT6, and includes selectors 100 to 105. As mentioned above, since the adding circuit 41 sequentially adds or subtracts the output signals O1 to O4 in synchronization with the clock signal CLK1, it can attenuate the high frequency component in the one-bit digital signal DO as well as the FIR filter 40. Since it is required to add or subtract the output signals O1 to O4 in synchronization with the clock signal CLK1 during a long period in order to increase an amount of attenuation of the high frequency component, the number of bits of the adding circuit 41 increases as a result, and when processing all the outputs from the adding circuit 41 by the microcomputer (not shown,) a load on the microcomputer (not shown) increases. In a case where an addition period or subtraction period in an adding circuit is made longer, an influence that a low-order bit has on an addition result or subtraction result becomes small. Therefore, in an embodiment of the present invention, lower-order 3 bits having little influence on an addition result or subtraction result are discarded, and higher-order 7 bits of the output signals AD1 to AD7 are input to the shift circuit 42 as mentioned above. The selectors 100 to 105 are the same as the above-mentioned selectors 60 to 63. According to an embodiment of the present invention, output signals AD1 to AD6 are input to X1 inputs of the selectors 100 to 105, respectively and the output signals AD2 to AD7 are input to X2 inputs of the selectors 100 to 105. The reversal signal REV is input to each of S inputs of the selectors 100 to 105. In an embodiment of the present invention, signals output from Y outputs of the selectors 100 to 105 are designated as the output signals OUT1 to OUT6. Therefore, when the reversal signal REV is L level, the output signals AD2 to AD7 are output among the output signals AD1 to AD7 as the output signals OUT1 to OUT6, and when the reversal signal REV is H level, the output signals AD1 to AD6 obtained by performing the one-bit right shift therefor are output among the output signals AD1 to AD7 as the output signals OUT1 to OUT6.

Next, an example will be described of an operation of the digital filter 32. Here, it is assumed that every time the one-bit digital signal DO is input to the FIR filter 40 based on the clock signal CLK, for example, the output signals O1 to O4 defined as (O1, O2, O3, O4)=(0, 1, 1, 0) "6 in a decimal number" are output. Both of the reset signal RST and enable signal CE are assumed to be H level, unless otherwise specified.

First, a case will be described where the reversal signal REV is L level, that is, a case where the adding circuit 41 performs adding processing. When the reversal signal REV is L level, signals input to the S inputs of the selectors 60 to 63 are H level. Therefore, the data input to X1 inputs of the selectors 60 to 63 are output from the Y outputs thereof, so that the output signals SO1 to SO4 defined as (SO1, SO2, SO3, SO4)=(0, 1, 1, 0) are sequentially output based on the clock signal CLK1. The output signals S01 to SO4 are input to the A inputs of the full adders 86 to 89 in the adding circuit 41, respectively. The reversal signal REV of L level, i.e., 0 (zero) is input to each of A inputs of the full adders 80 to 85 and the CI input of the full adder 89.

As mentioned above, the full adders 80 to 89 and the D flip-flops 90 to 99 make up a 10-bit adding circuit, and the output signals SO1 to SO4 defined as (SO1, SO2, S03, SO4)=(0, 1, 1, 0) are sequentially added.

Here, a case will be described as an example where the output signals SO1 to SO4 defined as (SO1, SO2, S03, SO4)=(0, 1, 1, 0) "6 in a decimal number" are input to the adding circuit 41 when the output signals AD1 to AD10 defined as (AD1, AD2, AD3, AD4, AD5, AD6, AD7, AD8, AD9, AD10)=(0, 0, 1, 0, 0, 0, 0, 0, 0, 0) "128 in a decimal number" are held in the adding circuit 41. First, when the output signals S01 to SO4 defined as (SO1, SO2, S03, SO4)=(0, 1, 1, 0) "6 in a decimal number" are input, a result becomes the output signals AD1 to AD10 defined as (AD1, AD2, AD3, AD4, AD5, AD6, AD7, AD8, AD9, AD10)=(0, 0, 1, 0, 0, 0, 0, 1, 1, 0) "134 in a decimal number" in the adding circuit 41.

Furthermore, a case where the output signals SO1 to SO4 defined as (SO1, SO2, S03, SO4)=(0, 1, 1, 0) are sequentially input to the adding circuit 41, a result becomes the output signals AD1 to AD10 defined as (AD1, AD2, AD3, AD4, AD5, AD6, AD7, AD8, AD9, AD10)=(0, 0, 1, 0, 0, 0, 1, 1, 0, 0) "140 in a decimal number." In this case, the output signals AD2 to AD7 among the output signals AD1 to AD7 are output from the shift circuit 42 as the output signals OUT1 to OUT6 as mentioned above. Therefore, the addition result in a case where the lower-order 3 bits are discarded among the 10-bit output signals AD1 to AD10 is expressed as the output signals OUT1 to OUT6 accordingly, which are the output signals OUT1 to OUT6 defined as (OUT1, OUT2, OUT3, OUT4, OUT5, OUT6)=(0, 1, 0, 0, 0, 1) "136 in a decimal number." Thus, in the case where the reversal signal REV is L level, when the output signals O1 to O4 from the FIR filter 40 corresponding to the one-bit digital signal DO are sequentially added based on the clock signal CLK1, an addition result almost equal to a 10-bit addition result is output as a 6-bit digital signal.

Next, a case will be described where the reversal signal REV is H level, that is, a case where the adding circuit 41 performs subtraction processing. When the reversal signal REV is H level, signals input to the S inputs of the selectors 60 to 63 are L level. Therefore, the data input to X2 inputs of the selectors 60 to 63 are output from the Y outputs thereof. Since signals obtained by reversing the output signals O1 to O4 defined as (O1, O2, O3, O4)=(0, 1, 1, 0) "6 in a decimal number" from the FIR filter 40 are output to the X2 inputs of the selectors 60 to 63 from the QN outputs of the D flip-flops 50 to 53, the output signals SO1 to SO4 defined as (SO1, SO2, S03, SO4)=(1, 0, 0, 1) are sequentially output based on the clock signal CLK1 as the output signals SO1 to SO4 accordingly. The reversal signal REV of H level, i.e., 1 is input to each of the A inputs of the full adders 80 to 85 and the CI input of the full adder 89. Therefore, in a case where "128 in a decimal number" is held in the adding circuit 41, when the output signals SO1 to SO4 defined as (SO1, SO2, S03, SO4)=(1, 0, 1, 0) and "1" to the A inputs of the full adders 80 to 85 are input, respectively, a result becomes the output signals AD1 to AD10 defined as (AD1, AD2, AD3, AD4, AD5, AD6, AD7, AD8, AD9, AD10)=(0, 0, 0, 1, 1, 1, 1, 0, 1, 0) "122 in a decimal number."

Furthermore, a case where the output signals SO1 to SO4 defined as (SO1, SO2, S03, SO4)=(1, 0, 1, 0) and "1" to the A inputs of the full adders 80 to 85 are sequentially input to the adding circuit 41, a result becomes the output signals AD1 to AD10 defined as (AD1, AD2, AD3, AD4, AD5, AD6, AD7, AD8, AD9, AD10)=(0, 0, 0, 1, 1, 1, 0, 1, 0, 0) "116 in a decimal number." Thus, in the case where the reversal signal REV is L level, the output signals O1 to O4 from the FIR filter 40 corresponding to the one-bit digital signal DO are sequentially subtracted based on the clock signal CLK1, to be output as a 10-bit digital signal. The output signals AD1 to AD7 obtained by discarding the lower-order 3 bits among the 10-bit output signals AD1 to AD10 of the adding circuit 41 are input to the shift circuit 42. Therefore, the output signals AD1 to AD7 defined as (AD1, AD2, AD3, AD4, AD5, AD6, AD7)=(0, 0, 0, 1, 1, 1, 0) "112 in a decimal number" are input to the shift circuit 42. Hereinafter, in an embodiment of the present invention, the lower-order 3 bits are not expressed when the output signals AD8 to AD10 of the lower-order 3 bits are discarded. In this case, the 7-bit output signals AD1 to AD7 obtained by performing the one-bit right shift are output as the output signals OUT1 to OUT6 from the shift circuit 42, as mentioned above. Therefore, the output signals OUT1 to OUT6 become the output signals OUT1 to OUT6 defined as (OUT1, OUT2, OUT3, OUT4, OUT5, OUT6)=(0, 0, 0, 1, 1, 1) "56 in a decimal number" accordingly.

Here, an operation of the sensor circuit 15 will be described, referring to a timing chart of main signals in the sensor circuit 15 shown in FIG. 5, and an example of an output of the digital filter 32 shown in FIG. 6.

Figure 5:
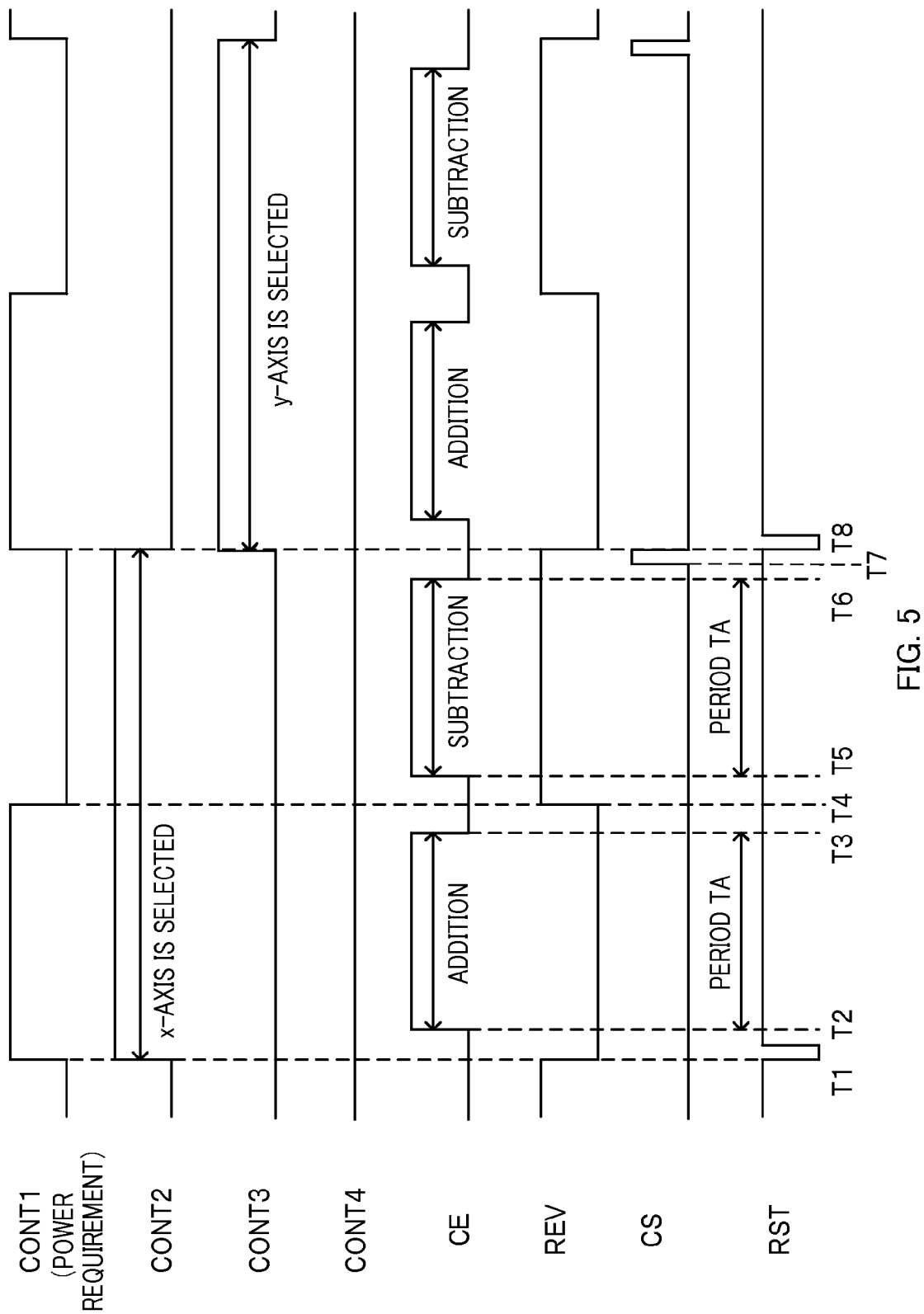
FIG. 5 is an example of a timing chart for explaining an operation of the sensor circuit 15 according to an embodiment of the present invention.

First, at time T1 in FIG. 5, the control circuit 23 outputs the control signal CONT1 of H level so that the nodes N1 and N2 are made in the first state where the nodes N1 and N2 are connected to the power supply VCC and the ground GND, respectively, outputs the control signal CONT2 of H level so that the output from the sensor 10 of the x-axis is selected, and outputs the control signals CONT3 and CONT4 of L level. Further, at the time T1, the control circuit 23 outputs the reset signal RST of L level for a predetermined period so that the adding circuit 41 in the digital filter 32 is reset, and outputs the reversal signal REV of L level so that the adding circuit 41 performs adding processing. At the time T1 when the nodes N1 and N2 are made in the first state, levels of the output signals AO1 and AO2 from the sensor 10 are not stabilized, and therefore, in a embodiment of the present invention, the enable signal CE of L level is input to the digital filter 32 so that the adding circuit 41 does not operate based on the output signals SO1 to SO4 and the clock signal CLK1 which are output from the FIR filter 40 at the time T1.

At time T2 when the levels of output signals AO1 and AO2 are stabilized, the control circuit 23 outputs the enable signal CE of H level so that the processing circuit 22 processes the output signals AO1 and AO2. In an embodiment according to the present invention, a period from the time T2 to time T3 during which the enable signal CE is H level is designated as a period TA. According to an embodiment of the present invention, the period TA is a period during which the addition result of the adding circuit 41, which performs adding processing when the digital signal DO being always H level as exemplified in FIG. 2 is input to the digital filter 32, is from 0 (decimal number to 512 (decimal number.) That is, the period TA is a period during which the output signals AD1 to AD7 of the adding circuit 41 are from (AD1, AD2, AD3, AD4, AD5, AD6, AD7)=(0, 0, 0, 0, 0, 0, 0) to (AD1, AD2, AD3, AD4, AD5, AD6, AD7)=(1, 0, 0, 0, 0, 0, 0). By setting up the above period TA, the adding circuit 41 can express the digital signal DO corresponding to the levels of the output signals AO1 and AO2 as a number which is any number among 0 to 512 (decimal number.) When assuming that offsets of the preamplifier 30 and the delta-sigma modulation circuit 31 are zero, for example, an addition result of the adding circuit 41 is 512 (decimal number) in a state where the nodes N1 and N2 is in the first state, while an addition result thereof is 0 (decimal number) in a state where the nodes N1 and N2 are in the second state since the rate of the digital signal DO being H level and the rate of the digital signal DO being L level are reversed, as mentioned above. When an addition result of the adding circuit 41 is 448 (decimal number) in a state where the nodes N1 and N2 is in the first state, an addition result thereof becomes 64 (decimal number) in a state where the nodes N1 and N2 is in the second state. That is, when an addition result of the adding circuit 41 is x in the first state, an addition result is 512-x (decimal number) in the second state.

Figure 6:
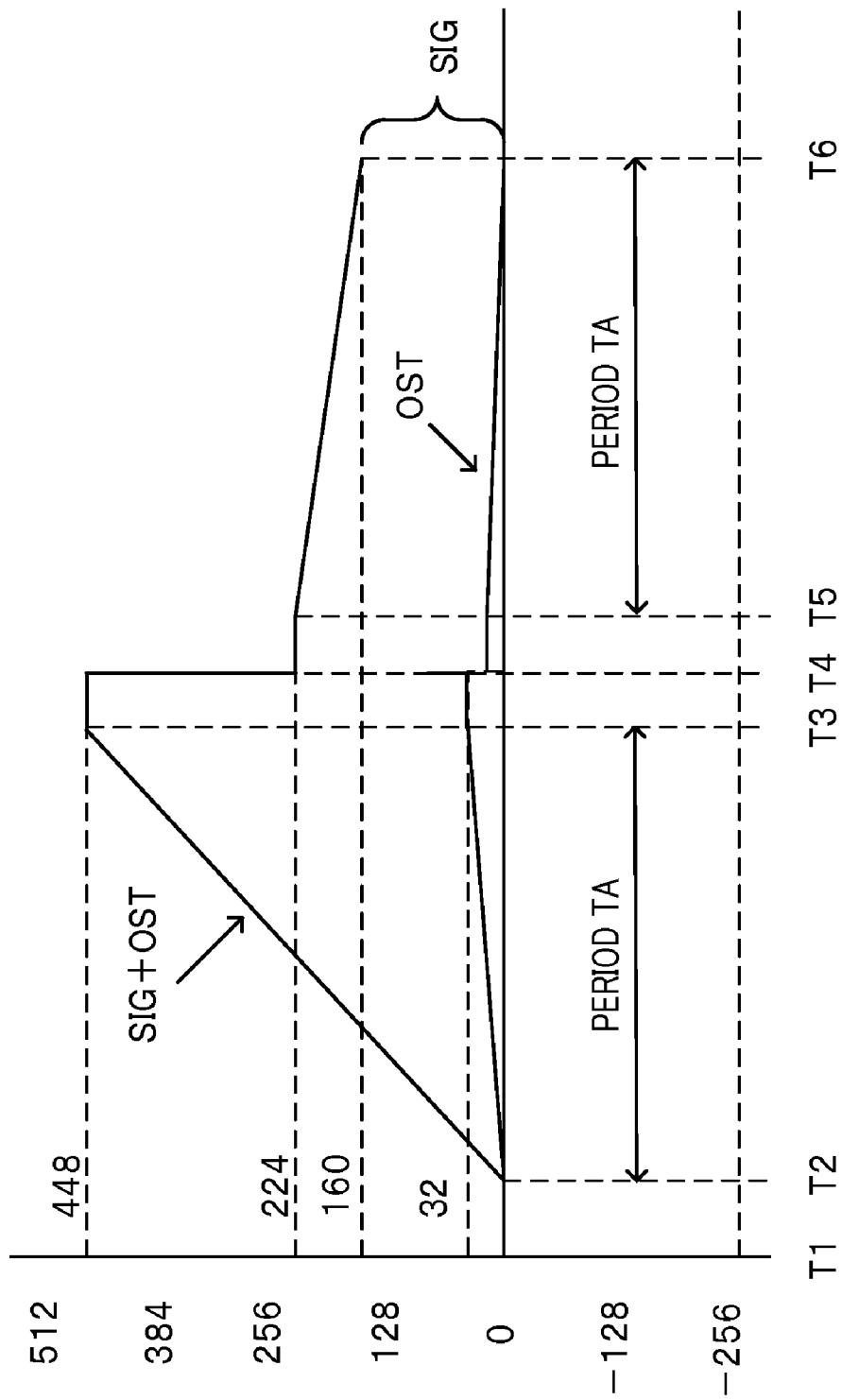
FIG. 6 is a diagram showing an example of an output in the digital filter 32 according to an embodiment of the present invention.
Figure 7:
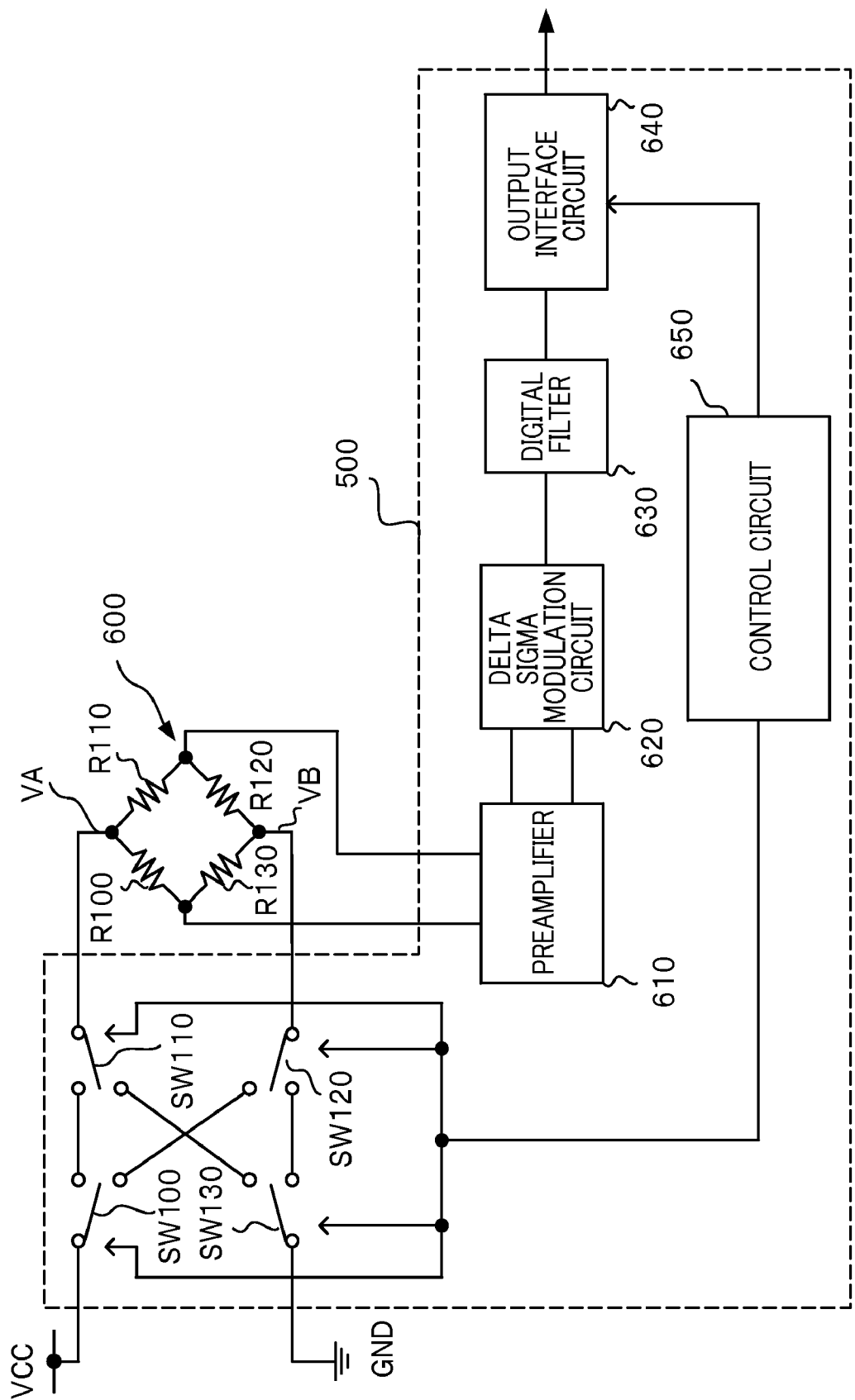
FIG. 7 is a diagram showing a configuration of a common sensor and sensor circuit.

Hereinafter, a description will be made by giving an example of a case where such a digital signal DO in the digital filter 32 that the 6-bit output signals OUT1 to OUT6 are set at 448 (decimal number) is output from the delta-sigma modulation circuit 31 at the time T3 when the period TA has passed since the time T2, as shown in FIG. 6, in an embodiment of the present invention. That is, the output signals AD1 to AD7 defined as (AD1, AD2, AD3, AD4, AD5, AD6, AD7)=(0, 1, 1, 1, 0, 0, 0) "448 in a decimal number" are held in the output signals AD1 to AD7 of the adding circuit 41 at the time T3. The digital signal DO from the delta-sigma modulation circuit 31 corresponds to a level difference between the output signals AO1 and AO2, and the offsets in the preamplifier 30 and the delta-sigma modulation circuit 31. Here, when a signal showing the level difference between the output signals AO1 and AO2 is designated as an output signal SIG, and the offsets in the preamplifier 30 and the delta-sigma modulation circuit 31 are designated as an offset signal OST obtained by converting the offsets assuming that the offsets are generated in the input in the preamplifier 30, the digital signal DO and the addition result of the adding circuit 41 change according to a sum of the output signal SIG and the offset signal OST. Hereinafter, in an embodiment of the present invention, it is assumed that 416 (decimal number) is added by the output signal SIG and 32 (decimal number) is added by the offset signal OST, for example, out of 448 (decimal number) which is an addition result of the adding circuit 41.

At time T4, the control circuit 23 changes the control signal CONT1 into L level from H level so that a level of the output signal AO1 and a level of the output signal AO2 are exchanged with each other, and the nodes N1 and N2 are changed in state from the first state into the second state. Furthermore, the control circuit 23 changes the reversal signal REV into H level from L level so that the adding circuit 41 in the digital filter 32 performs subtraction processing. In this case, since the enable signal CE is L level and the addition result of the adding circuit 41 is not updated, the output signals AD1 to AD7 of the adding circuit 41 are not changed so that the output signals AD1 to AD7 defined as (AD1, AD2, AD3, AD4, AD5, AD6, AD7)=(0, 1, 1, 1, 0, 0, 0) "448 in a decimal number" are held. In the shift circuit 42, the one-bit right shift is performed for the output signals AD1 to AD7. Therefore, 6 bit outputs of the digital filter 32 at the time T4 become the output signals OUT1 to OUT6 defined as (OUT1, OUT2, OUT3, OUT4, OUT5, OUT6)=(0, 1, 1, 1, 0, 0) "224 in a decimal number," that is half of 448 (decimal number) which is 6 bit outputs in the digital filter 32 at the time T3.

Furthermore, at time T5 when the levels of the output signals AO1 and AO2 are stabilized, the control circuit 23 outputs the enable signal CE of H level so that the output signals SO1 to SO4 and the clock signal CLK1 are input to the adding circuit 41. The period from the time T5 to T6 is assumed to be the period TA equivalent to the period from the time T2 to T3. Here, since 416 (decimal number) out of addition results in the period TA from the time T2 to T3 is assumed to be added by the output signal SIG as mentioned above, only 96 (96=512−416) is subtracted by the output signal SIG in the period TA from the time T5 to T6 by changing a state of the nodes N1 and N2 to the second state and exchanging the levels of output signals AO1 and AO2. On the other hand, even if the nodes N1 and N2 is made in the second state so that the processing of the adding circuit 41 is changed into subtraction from addition, a bias state of the preamplifier 30 and the delta-sigma modulation circuit 31 are not changed, and therefore, the offset signal OST does not change. Accordingly, a value to be subtracted by the offset signal OST in the period TA from the time T5 to T6 is 32 which is equivalent to a value to be added in the period TA from the time T2 to T3. Therefore, in the period TA equivalent to the period from the time T2 to T3 and the period from time T5 to T6, the values of the output signals AO1 and AO2 are exchanged with each other and the addition and subtraction processing is performed, so that only the offset signal OST can be canceled as well as only the output signal SIG can be output. In specific, first, in the adding processing in the period from the time T2 to T3, 416 (decimal number) by the output signal SIG and 32 (decimal number) by the offset signal OST are added, so that 448 (decimal number) is held as an addition result in the adding circuit 41. Next, in the subtraction processing in the period from the time T5 to T6, 96 (decimal number) by a reversed output signal SIG and 32 (decimal number) by the offset signal OST are subtracted from the addition result. That is, the offset signal OST is canceled since 32 (decimal number) is subtracted after 32 (decimal number) added, and the output signal SIG is set to 320 (decimal number) since 96 (decimal number) is subtracted after 416 (decimal number) added. Thus, only the output signal SIG is output as the output signals AD1 to AD7 from the adding circuit 41. In the digital filter 32 according to an embodiment of the present invention as mentioned above, when the reversal signal REV of H level is output so that the subtraction processing is performed in the adding circuit 41, the one-bit right shift is performed for the output signals AD1 to AD7 from the adding circuit 41, resulting in the output signals OUT1 to OUT6. Therefore, 160 (decimal number) is output as the output signals OUT1 to OUT6 from the digital filter 32, as a result.

Furthermore, at time T7, the control circuit 23 outputs the output instruction signal CS of H level, so as to send 160 (decimal number) which is an output from the digital filter 32 to the microcomputer (not shown) through the output interface 33. At time T8 and thereafter, a timing chart indicates that an output of the sensor 11 of the y-axis is selected, and the output from the sensor 11 is made into the digital signals OUT1 to OUT6, to be sent to the microcomputer (not shown,) and the same process as that of the x-axis is performed. The same process is performed also as for the sensor 12 of the z-axis.

In the sensor circuit 15 according to an embodiment of the present invention including a configuration described above, the digital signal DO output from the delta-sigma modulation circuit 31 is added in the adding circuit 41 in the digital filter 32 during the period TA from the time T2 to T3, after the nodes N1 and N2 in the sensor 10 are changed in state into the first state at the time T1. Furthermore, in the sensor circuit 15, the digital signal DO output from the delta-sigma modulation circuit 31 is subtracted in the adding circuit 41 in the digital filter 32 during the period TA from the time T5 to T6, after the nodes N1 and N2 in the sensor 10 are changed in state into the second state from the first state at the time T4. As a result, in the adding circuit 41 the offset signal OST can be cancelled among the offset signal OST representing the offsets of the preamplifier 30 and the delta-sigma modulation circuit 31 and the output signal SIG representing a difference between the output signals AO1 and AO2, and only the output signal SIG can be converted into the 7-bit output signals AD1 to AD7. Therefore, according to an embodiment of the present invention, since the process for cancelling the offset signal OST by the microcomputer (not shown), for example, is not required, it is possible to reduce a process of the microcomputer (not shown.) Furthermore, according to an embodiment of the present invention, the offset adjustment to each circuit of the preamplifier 30 and the delta-sigma modulation circuit 31 is not required. Moreover, when compared to a case of using a chopper amplifier for adjusting an offset of the preamplifier 30, for example, the offsets of both the preamplifier 30 and the delta-sigma modulation circuit 31 can be cancelled according to an embodiment of the present invention, so that the offset adjustment can be performed with high accuracy.

According to an embodiment of the present invention, the one-bit digital signal DO output from the delta-sigma modulation circuit 31 is subjected to filtering in the FIR filter 40 to be output as the 4-bit output signals O1 to O4, and then the addition or subtraction processing is performed in the adding circuit 41. Addition or subtraction processing of the one-bit digital signal DO can be a processing where the digital signal DO is input to the up-down counter including a common T flip-flop, added by performing up counting, and subtracted by performing down counting, for example. However, when using the up-down counter including the above-mentioned common T flip-flop, since the digital signal DO is required to be directly input to the up-down counter including the T flip-flops, filtering cannot be performed for the digital signal DO in the FIR filter 40, for example, as in an embodiment of the present invention. Therefore, according to an embodiment of the present invention, when compared to a case of using the up-down counter including a common T flip-flop, for example, noise of the high frequency of the digital signal DO can be more reduced. Furthermore, a case will be described where such a digital signal DO is output that an addition result of the adding circuit 41 at the time T3 is 480 (decimal number) or 32 (decimal number), for example. Here, it is assumed that the offset signal OST is zero. First, in a case where an addition result of the adding circuit 41 at the time T3 is 480 (decimal number,) when the nodes N1 and N2 is changed in a state into the second state from the first state at the time T4, the rate of the digital signal DO being H level and the rate of the digital signal DO being L level are also reversed, and therefore, 32 (decimal number) is subtracted during a period from the time T5 to T6. Accordingly, an addition result of the adding circuit 41 at the time T6 becomes 448 (decimal number.) On the other hand, in a case where the addition result of the adding circuit 41 at the time T3 is 32 (decimal number,) when the nodes N1 and N2 is changed in a state into the second state from the first state at the time T4, 480 (decimal number) is subtracted at the time T5 to T6 as a result. Therefore, an addition result of the adding circuit 41 becomes −448 (decimal number.) Thus, according to an embodiment of the present invention, 7 bits are required for expressing an addition result at the time T6 by subtracting 6-bit data from the time T5 to T6 from 6-bit data from the time T2 to T3. According to an embodiment of the present invention, in the shift circuit 42, the 7-bit output signals AD1 to AD7 of the adding circuit 41 are subjected to the one-bit right shift to be output as the 6-bit output signals OUT1 to OUT6, and therefore, the number of bits can be reduced from 7 bits to 6 bits.

According to an embodiment of the present invention, lower-order 3 bits are discarded among the output signals AD1 to AD10 output from the 10-bit adding circuit 41, and only the high-order 7-bit output signals AD1 to AD7 are input to the shift circuit 42, as mentioned above. Therefore, when comparing an embodiment of the present invention with a configuration where the adding circuit 41 is the 7-bit adding circuit and all the output signals output from the 7-bit adding circuit are input to the shift circuit 42, for example, addition and subtraction can be performed during a long period when performing the addition or subtraction with the clock signal having the same frequency, with reducing an error in an addition or subtraction result, in an embodiment of the present invention. That is, since integration time of input data becomes long, it is possible to enhance attenuation of the high frequency component in the one-bit digital signal DO.

The above embodiments of the present invention are simply for facilitating the understanding of the present invention and are not in any way to be construed as limiting the present invention. The present invention may variously be changed or altered without departing from its spirit and encompass equivalents thereof.

In an embodiment of the present invention, although the one-bit right shift is performed for the output signals AD1 to AD7 in the shift circuit 42 at the time T4, it is not limited to this timing. The one-bit right shift may be performed in any timing in a period from the time T1 to the time T6 shown in FIG. 6. Moreover, for example, the one-bit right shift may always be performed for the output signals AD1 to AD7 while the sensor circuit 15 according to an embodiment of the present invention is operating, with the S inputs of the selectors 100 to 105 being fixed to H level.

Moreover, in an embodiment of the present invention, although the delta-sigma modulation circuit 31 and the FIR filter 40 are operated with the clock signal CLK having the same frequency, this is not limitative. For example, if an increase in power consumption is allowed, a frequency of the clock signal with which the FIR filter 40 operates may be twice the frequency with which the delta-sigma modulation circuit 31 operates. When the frequency of the clock signal with which the FIR filter 40 operates is made twice, as mentioned above, since a folding frequency in the FIR filter 40 becomes high as compared with a case where the FIR filter 40 operates with the clock signal having the same frequency, the noise of the high frequency of the digital signal DO can be more reduced. If the clock signal with which FIR filter 40 operates is made twice, the number of bits output from the FIR filter 40 is twice, and therefore, the numbers of the D flip-flop and the selector shown in FIG. 3 are required to be increased by one, accordingly.

Although the digital filter 32 according to an embodiment of the present invention performs adding processing and subtraction processing based on the rate of the digital signal DO being H level, a configuration may be made, for example, by using a common up-down counter such that when the nodes N1 and N2 of the sensor 10 are in the first state, a count value of the up-down counter is increased during a predetermined period based on the rate of the digital signal DO being H level, when the nodes N1 and N2 of the sensor 10 are in the second state, a count value of the up-down counter is decreased during the same predetermined period as that in the first state based on a calculation result obtained by calculating the rate of the digital signal DO being H level based on the rate of digital signal DO being L level.

What is claimed is:

1. An AD converter comprising:
   a delta-sigma modulation circuit configured to perform delta-sigma modulation for an analog signal from a bridge circuit, and output a delta-sigma modulated signal as a quantized signal, the bridge circuit being configured to output the analog signal according to physical quantity to be measured;
   a switch circuit configured to switch between a first state and a second state based on a logic level of a control signal, the first state being a state where a voltage of a first level is applied to one terminal of the bridge circuit and a voltage of a second level different from the first level is applied to the other terminal of the bridge circuit, the second state being a state where the voltage of the second level is applied to the one terminal and the voltage of the first level is applied to the other terminal; and
   an up-down counter configured to
      increase a count value based on a rate of the quantized signal being one logic level, during a predetermined period, when the bridge circuit is in the first state, and
      decrease the count value based on a rate of the quantized signal being one logic level, during the predetermined period, when the bridge circuit is in the second state, the count value being a value to be a digital signal according to the physical quantity.

2. The AD converter according to claim 1, wherein the up-down counter includes:
   a filter configured to perform filtering for the quantized signal so as to reduce noise of the quantized signal and output a filtered quantized signal as parallel data of a plurality of bits; and an adding and subtracting circuit configured to sequentially add the parallel data during the predetermined period so that the count value is increased when the bridge circuit is in the first state, and sequentially subtract the parallel data during the predetermined period so that the count value is decreased when the bridge circuit is in the second state.

3. The AD converter according to claim 1, further comprising:

a shift operation circuit configured to shift the count value so that the number of bits capable of representing the count value in the first state is equal to the number of bits capable of representing the count value in the second state.

4. The AD converter according to claim 2, further comprising:

a shift operation circuit configured to shift the count value so that the number of bits capable of representing the count value in the first state is equal to the number of bits capable of representing the count value in the second state.

5. The AD converter according to claim 3, wherein the count value of the adding and subtracting circuit is input to the shift operation circuit, the count value being represented by the number of bits, where at least one bit is discarded from the least significant bit side.

6. The AD converter according to claim 4, wherein the count value of the adding and subtracting circuit is input to the shift operation circuit, the count value being represented by the number of bits, where at least one bit is discarded from the least significant bit side.

* * * * *